United States Patent

Natarajan

[11] Patent Number: 5,976,286
[45] Date of Patent: Nov. 2, 1999

[54] MULTI-DENSITY CERAMIC STRUCTURE AND PROCESS THEREOF

[75] Inventor: Govindarajan Natarajan, Pleasant Valley, N.Y.

[73] Assignee: International Business Machines Corporation, Armonk, N.Y.

[21] Appl. No.: 08/950,222

[22] Filed: Oct. 14, 1997

[51] Int. Cl.⁶ ................................................. B32B 31/00
[52] U.S. Cl. .................. 156/60; 156/297; 156/306.3; 156/308.2; 156/325; 264/642; 264/643; 427/96; 427/123; 427/126.1; 427/126.3
[58] Field of Search ..................... 264/642, 643; 156/60, 297, 306.3, 308.2, 325; 427/96, 123, 126.1, 126.3

[56] References Cited

U.S. PATENT DOCUMENTS

| | | | |
|---|---|---|---|
| 5,089,455 | 2/1992 | Ketcham et al. | 501/104 |
| 5,176,772 | 1/1993 | Ohtaki | 156/89 |
| 5,232,765 | 8/1993 | Yano et al. | 428/195 |
| 5,300,163 | 4/1994 | Ohtaki | 156/89 |
| 5,368,667 | 11/1994 | Minh et al. | 156/89 |
| 5,480,503 | 1/1996 | Casey et al. | 156/89 |
| 5,601,672 | 2/1997 | Casey et al. | 156/252 |

*Primary Examiner*—Archene Turner
*Attorney, Agent, or Firm*—Aziz M. Ahsan

[57] ABSTRACT

The present invention relates generally to a new multi-density ceramic structure and process thereof. Basically, the present invention relates to a structure and method for forming laminated structures and more particularly to a structure and method for fabricating multi-layer ceramic products using very thin green sheets and/or green sheets with very dense electrically conductive patterns on top of thicker green sheet. The structure and method of the present invention enables the screening, stacking and handling of very thin green sheets and/or green sheets with very dense metallized patterns in the manufacture of multi-layer ceramic packages. The thin punched green sheets were tacked/bonded to thicker punched and screened green sheets to form a sub-structure which had excellent stability in screening and enabled further processing.

15 Claims, 2 Drawing Sheets

MULTI-DENSITY CERAMIC STRUCTURE AND PROCESS THEREOF

FIELD OF THE INVENTION

The present invention relates generally to a new multi-density ceramic structure and process thereof. Basically, the present invention relates to a structure and method for forming laminated structures and more particularly to a structure and method for fabricating multi-layer ceramic products using very thin green sheets and/or green sheets with very dense electrically conductive patterns on top of a thicker green sheet.

BACKGROUND OF THE INVENTION

Multi-layer ceramic (MLC) structures are used in the production of electronic substrates and devices. The MLCs can have various layering configurations. For example, a MLC circuit substrate may comprise patterned metal layers which act as electrical conductors sandwiched in between ceramic layers which act as a dielectric medium. For the purposes of interlayer interconnections, most of the ceramic layers have tiny holes or via holes. Prior to lamination, the via holes are filled with an electrically conductive paste, such as, a metallic paste, and sintered to form vias which provide the electrical connection between the layers. In addition, the MLC substrates may have termination pads for attaching semiconductor chips, connector leads, capacitors, resistors, to name a few.

Generally, conventional ceramic structures are formed from ceramic green sheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible green sheets. After punching, metal paste screening, stacking and laminating, the green sheets are fired or sintered at temperatures sufficient to burn-off or remove the unwanted polymeric binder resin and sinter the ceramic particulate together into a densified ceramic substrate. The present invention is directed to the screening, stacking and lamination steps of this process.

In the MLC packaging industry it is very common to use green sheets of various thicknesses. The thicknesses can typically vary from 6 mils to 30 mils and in general the art of punching and metallizing these layers are well known. Green sheet thicknesses below 6 mils, in general, are very scarcely used. This is due to a variety of reasons, such as, for example, handling, screening and stacking of green sheets thinner than 6 mils pose tremendous challenges. In fact the use of one to two mils thick ceramic green sheets, which are punched and screened, using traditional MLC technology does not exist in the prior art.

Also, in the MLC packaging industry it is very common to use capacitor layers. The capacitance necessary in a package depends on the design and such capacitance is obtained by choosing proper dielectric layer thickness and metal area within a layer. The industry is always striving for higher capacitance and since the metal area is maxing out for a given substrate size it is necessary to use thinner dielectric layers between electrodes to obtain the required capacitance. For example, as a rule of thumb one could double the capacitance for a given dielectric system and electrode metal area by decreasing the dielectric layer thickness by half. Additionally the number of layers needed for capacitance in a package as well has been reduced by about 50 percent. The reduction in the number of layers is desirable, as it reduces the cost and the process of making the substrate.

The term thin sheet or layer as used herein means that the thickness of the sheet can be anywhere from about 0.5 mil to about 6.0 mils. Production level screening and stacking of thin sheets is not possible with the current technology as the thin sheets tend to shrink a lot and they also tend to distort during the process.

U.S. Pat. Nos. 5,176,772 and 5,300,163, addresses a method of forming a thin sintered ceramic board by laminating punched and screened green tapes on a presintered ceramic body and sintering the assembly to obtain a flat board. This method essentially enables one to obtain a flat laminate. But, with ceramic substrates with materials like alumina and aluminum nitride there is typically a 14 to 20 percent X-Y shrinkage. So there will be delamination and distortion involved in sintering due to presintered base. Furthermore, one needs to handle these sheets through screening in free standing state.

U.S. Pat. No. 5,368,667, teaches preparing a multi-layer capacitor which is one to two mils thick by extruding a thick dielectric layer and a metal containing layer through a roll laminator. This approach is good for using a thin layer having the blanket metallurgy. But in almost all multi-layer ceramic packages, one needs to have vias for electrical connectivity. However, this patent does not address the problem of handling the thin sheets in via filling and stacking.

U.S. Pat. No. 5,480,503, teaches releasably-supporting the thin green sheets on a temporary carrier support having an ablatable release layer over a patterned conductive layer, and filling the vias with conductive metal paste, whereby the thin green sheets are supported against warpage and distortion. The supported green sheets are formed as single layers, pairs and stacks thereof, and separated from temporary support for use. The suggested temporary support is a glass plate. The metallization technique is CVD type plating and in the process has to use non-ablatable and ablatable films on the green sheet. These films inherently will distort the green sheet during temperature and pressure processing. Further the non-ablatable film stays with every single green sheet layer and will create delamination and density difference in sintering. This is a very complicated and very expensive process.

The structure and method of the present invention enables the screening, stacking and handling of very thin green sheets and/or green sheets with very dense metallized patterns in the manufacture of multi-layer ceramic packages. With the preferred embodiment, thin punched green sheets were tacked and bonded to thick punched and screened green sheets to form a sub-structure which yielded excellent stability in screening and enabled excellent handling and alignment in stacking. The green sheet may have electrically conductive features within them, such as, a via, or over them, such as, a line, cap, to name a few.

PURPOSES AND SUMMARY OF THE INVENTION

Bearing in mind the problems and deficiencies of the prior art it is therefore one purpose of the present invention to provide a novel method and structure for producing metallized thin green sheets including sub-structures in multi-layer ceramic packages as capacitor layers or with fine line patterned conductive metal layers.

Another purpose of this invention is to provide a structure and a method that will ensure multiple thin layers in a multilayer ceramic package.

Still another purpose of the present invention is to provide a structure and method that will ensure higher capacitance in a multi-layer ceramic package.

Yet another purpose of the present invention is to have a structure and a method for fine line pattern using thin green sheets in multi-layer ceramic packages.

Still yet another purpose of the present invention is to provide a structure and a method for metallizing a thin green sheet without any detrimental distortion.

Still another purpose of the present invention is to have a structure and a method that will ensure handling of thin green sheets for multi-layer ceramic packages.

It is another purpose of the invention to have a structure and a method that produces a multilayer ceramic package that is predictable and repeatable.

Another purpose of the present invention is to laminate several stacked green sheets to produce sub-structures.

Other purposes, objects and advantages of the present invention will in part be obvious and will in part be apparent from the specification.

Therefore, in one aspect this invention comprises a method for fabricating a multi-density ceramic substrate comprising the steps of:

(a) forming at least one electrically conductive feature on a thick ceramic green sheet;

(b) providing at least one thin ceramic green sheet with at least one via hole;

(c) aligning and placing said thin ceramic green sheet over the said thick ceramic green sheet;

(d) tacking and bonding at least one of said thin ceramic green sheet to said thick ceramic green sheet, and thereby fabricating said multi-density ceramic substrate.

In another aspect this invention comprises a multi-density ceramic substrate comprising at least one thin ceramic green sheet with at least one via hole in intimate contact with at least one thick ceramic green sheet, wherein at least one electrically conductive feature is sandwiched between said thin ceramic green sheet and said thick ceramic green sheet, and thereby forming said multi-density ceramic substrate.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The structure and method of the present invention enable the handling, screening and stacking of thin ceramic layers. These thin ceramic layers are used in the semiconductor industry for a variety of purposes, such as, for example, for a capacitor structure, or for a fine line pattern structure in MLC packages, to name a few. Basically, the invention is a novel structure and method where a thicker ceramic green sheet which is punched and screened is used as a base or a permanent support for a thinner ceramic punched green sheet layer. Additionally, the thicker permanent ceramic base acts as a shrinkage and distortion restrainer when the thinner ceramic sheet is screened with conductive paste and dried. Furthermore, the thinner green sheet on the thicker green sheet base has totally eliminated handling problems, such as, for example, in stacking.

Figure 1:
FIG. 1, illustrates a thin green sheet which has a via hole.

FIG. 1, illustrates a thin ceramic green sheet 10, with at least a via hole 11.

Thinness of a green sheet is a relative measure and it means as thin as one could preform to as thin as one could handle through via forming technique like mechanical punching or laser hole formation or very intensive chemical technique such as photo-processing.

Figure 2:
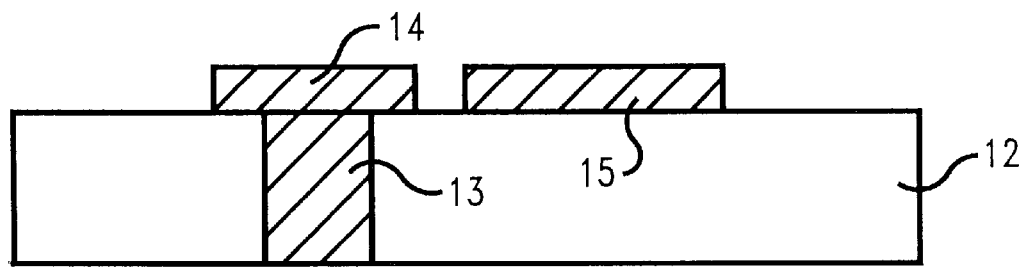
FIG. 2, illustrates a thick green sheet which has been punched and metallized.

FIG. 2, shows a thicker ceramic green sheet 12, with punched and screened via holes 13. Punching of via holes in ceramic green sheets 12, and filling the via holes with metallic or composite material 13, is well known in the art. Typically, an electrically conductive paste is screened into the via hole 13, and the green sheet 12, is metallized with an appropriate pattern 14 and 15. The patterns 14 and 15, could be an electrically conductive line or cap 14, 15.

Thickness of a green sheet is again a relative measure and it means as thick as the design warrants to and as thick as one could cast and personalize. Because it is a thicker sheet, it is possible to punch and screen these layers with conventional technique without any detrimental pattern distortion and radial error. In general a radial error greater than about 1.2 mils (plus and minus) is considered not good.

Figure 3:
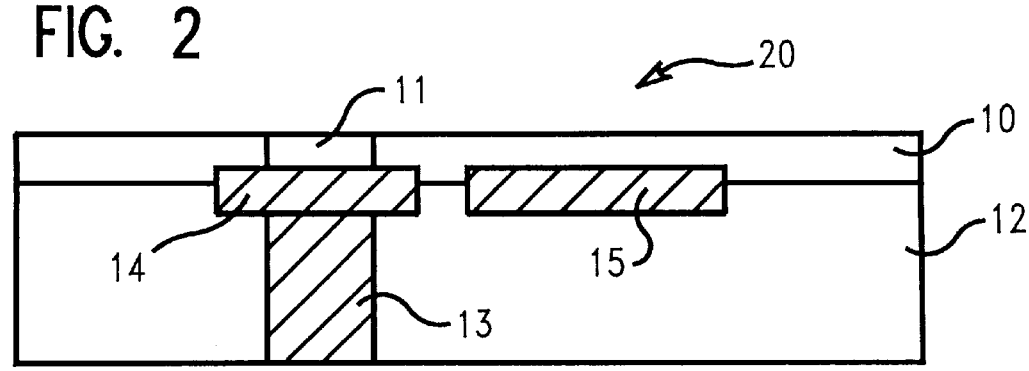
FIG. 3, illustrates the thin green sheet of FIG. 1, secured to the thick green sheet as shown in FIG. 2.

FIG. 3, illustrates a preferred embodiment of this invention where the thin green sheet 10, of FIG. 1, is secured to the thicker green sheet 12, as shown in FIG. 2. The punched thin green sheet 10, can be secured to the punched and screened thicker ceramic green sheet 12, by bonding or tacking. Via hole 11, is a punched but not a filled via hole in the tacked or bonded thin ceramic green sheet 10. The screened features 14 and 15, in the thicker green sheet 12, can be above the surface of the sheet 12, as shown in FIG. 2, or partially or fully imbedded in the sheet 12, as shown in FIG. 3.

The bonding and/or tacking of the thinner green sheet 10, to the thicker green sheet 12, can be achieved by a variety of processes, such as, for example, a lamination process. It is very important that the bonding and/or tacking process used should not distort the features 14 and 15, located on the thicker sheet 12. A lamination pressures of less than 800 psi and a temperature of less than 90° C. was found suitable for the bonding and/or tacking operation.

After the bonding/tacking process a multi-media or multi-density sub-structure 20, was obtained, which comprises of at least one thin ceramic layer 10, and at least one thick ceramic layer 12. The multi-density structure 20, looks and behaves as a single green sheet layer 20. The sub-structure 20, has via hole 11, which starts from one surface and does not go all the way through. Furthermore, metallized vias 14, are very well aligned with the screened vias 13, and non-screened via hole 11, and thus enable top to bottom alignment. These unique features of this invention enable the handling of the thin ceramic sheet 10, as a sub-structure 20. Furthermore, the sub-structure 20, has no other material set, other than the green sheets 10 and 12, and the screened paste to form features 13, 14 and 15, which requires least processing cost and provides best yields.

Figure 4:
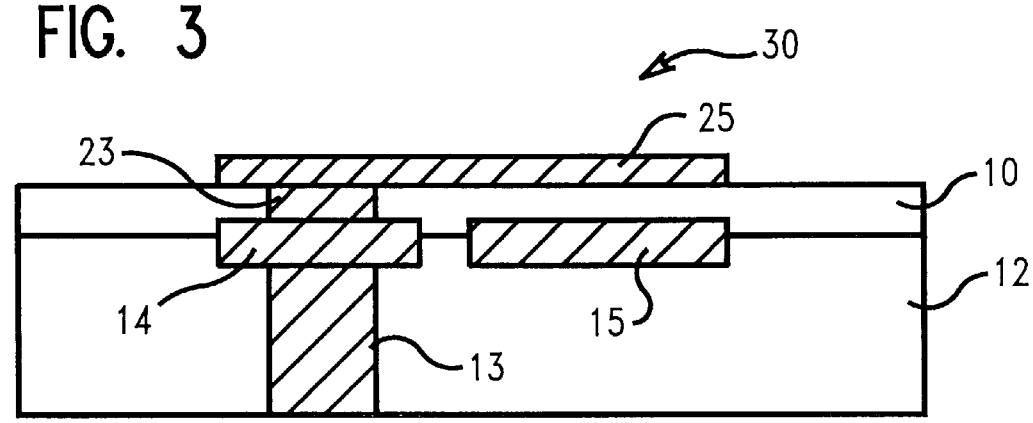
FIG. 4, illustrates the metallization of the structure shown in FIG. 3.

FIG. 4, illustrates the metallization of the screened sub-structure 20, shown in FIG. 3. Here the sub-structure 20, was screened with an electrically conductive metal or composite paste to form features 23 and 25, on the thin ceramic sheet 10. Feature 23, could be a via 23, formed in the via hole 11, while the feature 25, could be a pattern 25, such as, a cap or line 25. The structure 30, of this invention shows features 23 and 25, in the thin green sheet layer 10, that makes electrical connection to via 13, and pattern 14, on the thick green sheet 12.

Figure 5:
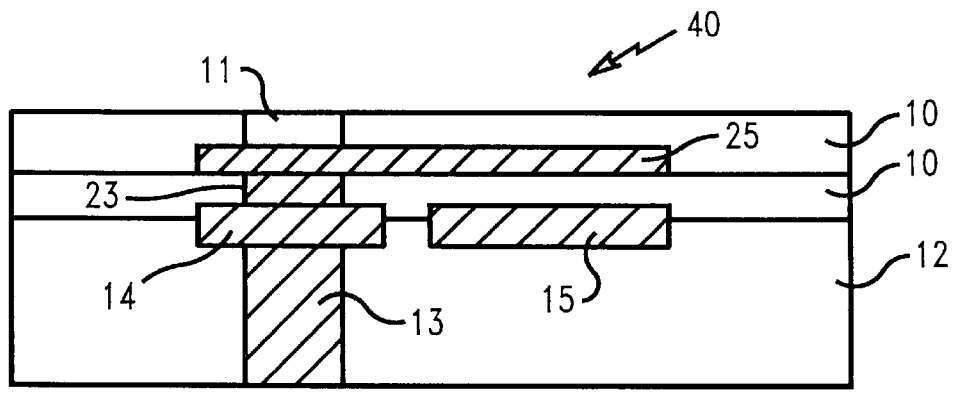
FIG. 5, illustrates another embodiment of this invention where another layer of a thin green sheet as shown in FIG. 1, has been secured to the structure shown in FIG. 4.

FIG. 5, illustrates another embodiment of this invention where the structure 30, as shown in FIG. 4, has been secured with another layer of a thin green sheet 10, as shown in FIG. 1, to form a structure 40. Basically, the screened structure 30, that was obtained as described from FIG. 1 through 4, was secured, such as, by tacking/bonding, to a punched thin ceramic layer 10, as illustrated in FIG. 1.

Figure 6:
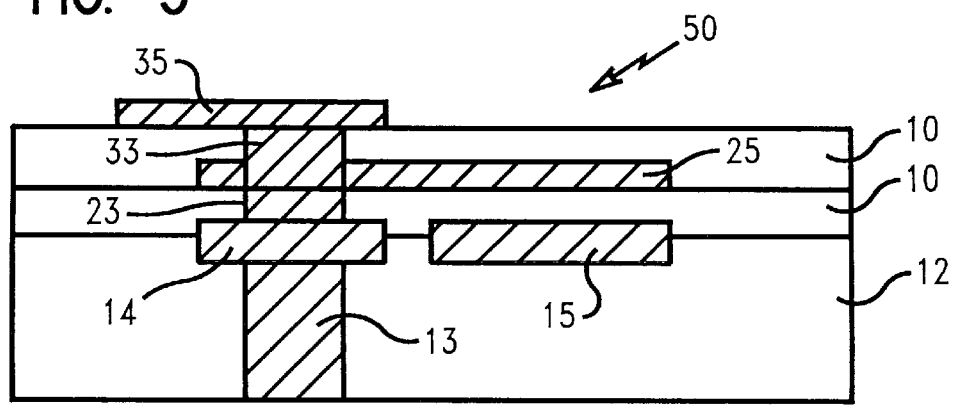
FIG. 6, illustrates the metallization of the thin green sheet of the structure shown in FIG. 5.

FIG. 6, illustrates the metallization of the structure 40, as shown in FIG. 5, to form a structure 50. The via hole 11, is filled with an electrically conductive material 33, such that, the material 33, is in direct contact with via 23, of the earlier thin ceramic layer 10. And a metallization 35, is in direct contact with the via 33, of the new thin green sheet 10. This multi-density structure 50, can now be further processed as a ceramic material 50.

Many sub-structures can be built with as many thin green sheets 10, as necessary to build a final MLC laminate. As one can clearly see in FIG. 6, that the sub-structure 50, has one thick green sheet 12, and two thin green sheets 10, and this structure 50, has the rigidity for handling through screening and stacking. Furthermore, the dimensional stability of the screened features in thin sheets 10, would be far better when screened as a sub-structure compared to screened as a free standing thin sheet 10.

Figure 7:
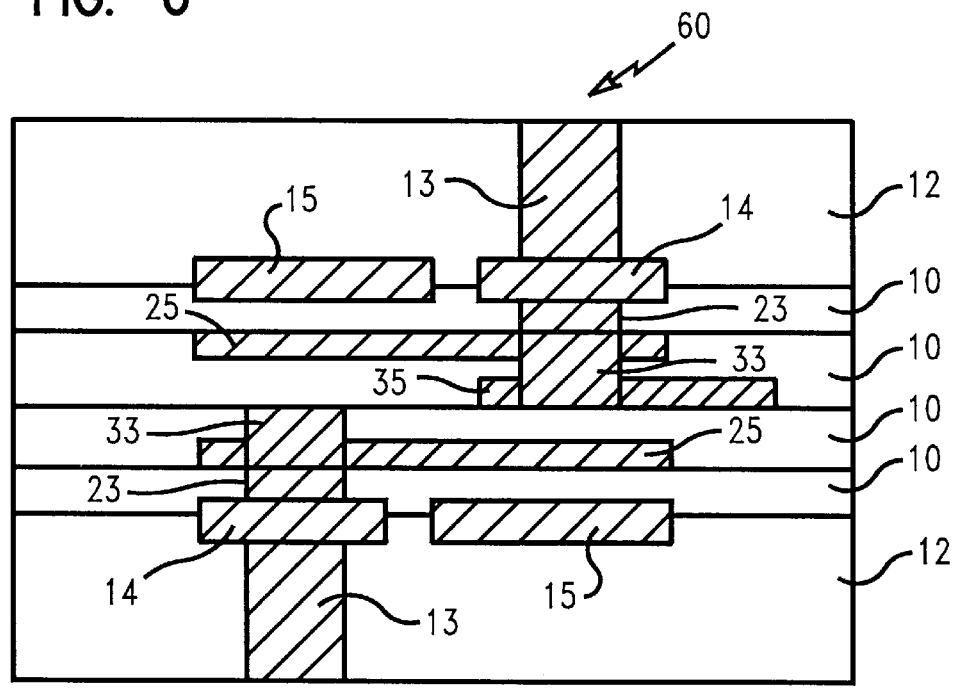
FIG. 7, illustrates another embodiment of this invention showing the structure of FIG. 6, being used to form a multilayer ceramic package.

FIG. 7, illustrates another embodiment of this invention showing the structure of FIG. 6, being used to form a multi-layer multi-density ceramic package 60. The package 60, could be formed by combining, for example, two sub-structures 50, resulting in the ceramic package 60, comprising of at least one thick ceramic layer 12, and at least one thin ceramic layer 10. The two sub-structures 50, could be tacked/bonded to each other and could also include several thin ceramic green sheets 10.

The green sheet could have one or more electrically conductive features, such as, for example, cap, line, via, to name a few. These features could be made from at least one electrically conductive material.

The electrically conductive material used with this invention is preferably selected from a group comprising copper, molybdenum, nickel, tungsten, metal with glass frit, metal with glass grit, to name a few.

The material for the ceramic green sheet is preferably selected from a group comprising alumina, alumina with glass frit, borosilicate glass, aluminum nitride, glass ceramic, to name a few.

The tacking and/or bonding could be done in a chemical environment, and wherein the chemical is preferably selected from a group comprising water, methanol, methyl-iso-butyl ketone, isopropyl alcohol, alumina, aluminum nitride, borosilicate, glass ceramic, copper, molybdenum, tungsten, nickel, to name a few.

Another advantage of this invention is the ability to punch, screen and stack very dense via and pattern in a package. As the via and pattern metal density increases in a green sheet (thick or thin) the feature radial error increases as well when one handles the green sheets as a free standing body. In such instances one could use the same or similar process as described and illustrated in FIGS. 1 through 7. Basically, the dense patterns are screened on the ceramic sub-structures rather than on the free standing ceramic green sheets. It has been found that the shrinkage and distortion is far smaller when sub-structures are screened than when the free standing green sheets are similarly processed. Furthermore, the sub-structures are built using the normal green sheet materials and the existing electrically conductive metal/composite pastes.

EXAMPLES

The following examples are intended to further illustrate the invention and are not intended to limit the scope of the invention in any manner.

Example 1

Several samples of multi-layer ceramic sub-structures containing thin green sheets 10, of thicknesses varying from about 0.8 mils to about 6.0 mils, were built on thick ceramic green sheets 12, of various thicknesses ranging from about 6 mils to about 20 mils, using the method of this invention and which resulted in a structure 20, as shown in FIG. 3. The material for the ceramic green sheet 10 and 12, included alumina and glass ceramic. While the electrically conductive material included molybdenum, copper and other well-known composites. The sub-structures 20, were built at various pressures up to about 800 psi and with temperatures up to about 90° C. In all cases the sub-structures were measured for radial error. The radial errors were found to be less than about 1.2 mils, which showed a good layer to layer contact and alignment.

Example 2

Several single thin ceramic green sheets 10, with thicknesses ranging from about 0.8 mils to about 3.0 mils were punched and screened as a free standing sheet 10. The material set for the green sheet 10, included alumina and glass ceramic and the electrically conductive material, such as, the metal paste, included molybdenum, copper and other composites. In all cases the free standing screened thin ceramic layers 10, were measured for radial errors. The measured radial errors in all cases was more than about 1.2 mils and ranged up to about 15.0 mils. It was also noticed that the free-standing screened thin layers 10, were all wrinkled and non-usable.

Example 3

Several samples of multi-layer ceramic sub-structures containing thin ceramic green sheets 10, of thicknesses varying from about 0.8 mils to about 6.0 mils were built with wiring density of about 3 mils on about 7 mil pitch using the method of this invention and the structures of FIG. 3, on thick green sheets 12, of various thicknesses ranging from about 6 mils to about 8 mils. The materials for the ceramic green sheets 10 and 12, included alumina and glass ceramic. The electrically conductive material included molybdenum, copper and composites. The sub-structures were built at various pressures up to about 800 psi and with temperatures up to about 90° C. In all cases the sub-structures were measured for radial error. It was found that the radial errors were less than about 1.2 mils, which meant a good layer to layer contact and alignment.

Example 4

Several thin single green sheets 10, with thicknesses ranging from about 0.8 mils to about 6 mils, and wiring density of about 3 mil features on about 7 mil pitch were punched and screened as a free standing thick ceramic sheet. The material for the green sheet included alumina and glass ceramic and the material for the electrically conductive metal paste included molybdenum, copper and composites. In all cases the layers were measured for radial error. The measured radial errors in all cases were more than about 1.2 mils and ranged up to about 25 mils.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for fabricating a multi-density sub-structure comprising the steps of:
   (a) forming at least one electrically conductive feature on a thick green sheet;
   (b) providing at least one thin green sheet with at least one unfilled via hole;
   (c) aligning and placing said thin green sheet over said thick green sheet;
   (d) tacking and bonding at least one of said thin green sheet with said at least one unfilled via hole to said thick green sheet, and thereby fabricating said multi-density sub-structure.

2. The method of claim 1, wherein said at least one via hole is filled with at least one first electrically conductive material.

3. The method of claim 2, wherein at least one of the material for said first electrically conductive material is selected from a group comprising copper, molybdenum, nickel, tungsten, metal with glass frit or metal with glass grit.

4. The method of claim 2, wherein at least one second electrically conductive material is formed over the surface of said thin green sheet, such that said second electrically conductive material is in direct electrical contact with said first electrically conductive material.

5. The method of claim 4, wherein at least one of the material for said second electrically conductive material is selected from a group comprising copper, molybdenum, nickel, tungsten, metal with glass frit or metal with glass grit.

6. The method of claim 1, wherein the material for said at least one thin green sheet is selected from a group comprising alumina, alumina with glass frit, borosilicate glass, aluminum nitride, ceramic or glass ceramic.

7. The method of claim 1, wherein the material for said at least one thick green sheet is selected from a group comprising alumina, alumina with glass frit, borositicate glass, aluminum nitride, ceramic or glass ceramic.

8. The method of claim 1, wherein the thickness of said thin green sheet is between about 0.5 mils to about 6.0 mils.

9. The method of claim 1, wherein said thick green sheet is at least 6 mils thick.

10. The method of claim 1, wherein said tacking and bonding between said thin green sheet and said thick green sheet is done using means selected from a group comprising thermal means, mechanical means or chemical means.

11. The method of claim 1, wherein during step (d) said tacking and bonding is done at a temperature of less than about 90° C.

12. The method of claim 1, wherein during step (d) said tacking and bonding is done at a pressure of less than about 800 psi.

13. The method of claim 1, wherein during step (d) said tacking and bonding is done in a chemical environment, and wherein said chemical is selected from a group comprising water, methanol, methyl-iso-butyl ketone, isopropyl alcohol, alumina, aluminum nitride, borosilicate, glass ceramic, copper, molybdenum, tungsten and nickel.

14. The method of claim 1, wherein at least one of said electrically conductive feature on said thick green sheet is selected from a group comprising cap, line or via.

15. The method of claim 14, wherein at least one of the material for said electrically conductive feature is selected from a group comprising copper, molybdenum, nickel, tungsten, metal with glass frit or metal with glass grit.

* * * * *